United States Patent [19]
Moriguchi

[11] Patent Number: 5,940,352
[45] Date of Patent: Aug. 17, 1999

[54] RECORD MEDIUM DEVICE FOR RECORDING AND REPRODUCING TIME CODES SYNCHRONIZED WITH INPUT/REPRODUCTION SIGNALS INTO AND FROM RECORD MEDIUM HAVING UTOC AREA, AND RECORD MEDIUM HAVING UTOC AREA

[75] Inventor: Yasumichi Moriguchi, Fukushima, Japan

[73] Assignee: Nippon Columbia Co. Ltd., Tokyo, Japan

[21] Appl. No.: 08/932,461

[22] Filed: Sep. 18, 1997

[30] Foreign Application Priority Data

| Oct. 8, 1996 | [JP] | Japan | 8-285991 |
| Nov. 20, 1996 | [JP] | Japan | 8-324794 |

[51] Int. Cl.⁶ .................................................. G11B 11/00
[52] U.S. Cl. ............................... 369/32; 369/48; 369/54; 369/58; 369/275.3
[58] Field of Search ................... 369/32, 48, 47, 369/54, 58, 275.3, 275.1, 124

[56] References Cited

U.S. PATENT DOCUMENTS

| 5,177,720 | 1/1993 | Kondo | 369/32 |
| 5,295,126 | 3/1994 | Okano et al. | 369/47 |
| 5,426,624 | 6/1995 | Goto | 369/32 |
| 5,504,728 | 4/1996 | Yokota et al. | 369/58 |
| 5,537,387 | 7/1996 | Ando | 369/275.1 |
| 5,546,365 | 8/1996 | Roth | 369/32 |
| 5,684,770 | 11/1997 | Kim | 369/47 |
| 5,691,968 | 11/1997 | Tomishima et al. | 369/32 |
| 5,701,282 | 12/1997 | Matsumoto et al. | 369/32 |
| 5,734,787 | 3/1998 | Yonemitsu et al. | 369/48 |
| 5,784,349 | 7/1998 | Ogusu et al. | 369/58 |

FOREIGN PATENT DOCUMENTS

| 1-91389 | 4/1989 | Japan . |
| 0 571 147 A2 | 11/1993 | Japan . |
| 0 595 358 A2 | 5/1995 | Japan . |
| 0 651 392 A1 | 5/1995 | Japan . |
| 2 283 359 | 5/1995 | United Kingdom . |

OTHER PUBLICATIONS

Abstract No. 76 P 903, Japanese Patent No. 1–91389 to K.K. Fuosutekusu et al., "Digital Audio Tape Recorder".

Primary Examiner—John W. Cabeca
Assistant Examiner—Kim-Kwok Chu
Attorney, Agent, or Firm—Dickstein Shapiro Morin & Oshinsky LLP

[57] ABSTRACT

A record medium device recording/reproducing signals in a format without time code from a record medium, yet being able to record/reproduce time codes. Time-code conversion circuit 16 obtains a time code indicating a head of a track from time code signals synchronized with input signals. The system controller 3 records the input signals into an MD 1 through a magnetic head 24. Further, the system controller 3 records the obtained time code indicating the head of the track into a UTOC area of the MD 1, relating the time code to the track in question. By this construction, it is possible to generate time codes synchronized with reproduction signals based on a time code which is related to a track to be reproduced and indicates a head of the track in question.

24 Claims, 9 Drawing Sheets

CONCEPTUAL DATA CONSTRUCTION OF NAME
INFORMATION STORING SECTOR OF UTOC

| SECTOR NO | 1 |
|---|---|
| DISC | NEW YEAR CONCERT |
| TNO.1 | PRELUDE A12000000012023025B |
| TNO.2 | 1ST MOVEMENT |
| TNO.3 | . |
| . | . |
| . | |
| | |

ITEM / NAME

FIG.4

CONCEPTUAL DATA CONSTRUCTION OF TIME CODE
INFORMATION STORING SECTOR OF UTOC

| SECTOR NO | X | | | | |
|---|---|---|---|---|---|
| TNO.1 | 12000000 | 12023025 | 001 | 0 | 000000000000 |
| TNO.2 | . | . | . | . | . |
| TNO.3 | . | . | . | . | . |
| . | . | . | . | . | . |

ITEM / TIME CODE Ta OF HEAD OF TRACK / TIME CODE Tb OF END OF TRACK / TYPE OF TIME CODE / PHASE INFORMATION

PHASE CORRECTION CONTROL INFORMATION

RECORD MEDIUM DEVICE FOR RECORDING AND REPRODUCING TIME CODES SYNCHRONIZED WITH INPUT/REPRODUCTION SIGNALS INTO AND FROM RECORD MEDIUM HAVING UTOC AREA, AND RECORD MEDIUM HAVING UTOC AREA

BACKGROUND OF THE INVENTION

1. Field of the Invention

The present invention relates to a record medium device for recording and reproducing signals having time code for each frame, such as video signals handled in a VCR (Video Cassette Recorder), into and from a record medium, such as an MD (Mini-disc) or a solid-state memory card, having a UTOC (User Table Of Contents) area for storing track address information, track name information or the like.

2. Description of Related Art

In an MD device or a solid-state memory card device, recording or reproduction of signals is performed in accordance with information, such as an address table containing start addresses, end addresses and link addresses for accessing tracks (pieces of music), or information on track names, recorded in a UTOC area of the MD or solid-state memory card.

An MD or a solid-state memory card contains a TOC (Table Of Contents) as management information recorded in the disc or the card in advance, which includes type information showing whether or not the disc or card is recordable, and if it is recordable, the numbers of the first and last pieces of music recorded, the start addresses of the lead-out and UTOC, and the start address of the recordable area. In that case, TOC is called as "PTOC" for an MD. If not recordable, a TOC contains numbers given to respective pieces of music, and absolute and relative starting and ending times of the pieces. In that case, it is simply called TOC for a read-only MD or CD (Compact DISC).

On the other hand, a UTOC is information for management of tracks (pieces of music) recorded by a user, and contains addresses (start addresses, end addresses, and link addresses) for accessing the tracks, as well as names of the respective tracks etc.

SUMMARY OF THE INVENTION

Video signals etc. recorded and reproduced by a VCR etc. include time code for each frame. When such video signals are recorded or reproduced using an ordinary MD device or a solid-state memory card device, time code signals included in each frame can not be recorded or reproduced.

The present invention has been completed taking the abovedescribed conditions into consideration. An object of the present invention is to make it possible to record and reproduce time codes in a record medium, such as an MD device, a solid-state memory card device, etc., in which signals are recorded and reproduced in a format without time code.

To accomplish the above-described object, the present invention provides, in its first mode, a record medium device which records time codes synchronized with input signals into a record medium having a UTOC (User Table Of Contents) area, comprising:

input signal recording means for recording input signals into said record medium;

time-code obtaining means for obtaining time code indicating a head of a track of said input signals from the time codes synchronized with the input signals; and time-code recording means for recording the time code, which indicates the head of the track obtained by said time-code obtaining means, into the UTOC area of said record medium, relating said time code to the track in question.

Here, the record medium having a UTOC area is, for example, an MD (Mini-disc), solid-state memory card, or the like.

The time-code obtaining means obtains a time code indicating a head of a track of input signals by latching a time code synchronized with input signals, being timed to, for example, start of recording of input signals and/or change of tracks for input signals.

According to the first mode of the present invention, employing the above-described construction, a time code indicating a head of a track of input signals is recorded in a UTOC area, being related to the track in question.

The record medium on which input signals have been recorded is used to reproduce signals in a record medium device according to the second mode of the present invention to be described below so as to generate the time codes synchronized with the reproduction signals.

In the second mode of the present invention, a record medium device which generates time codes synchronized with reproduction signals, from a record medium on which time codes indicating heads of tracks are recorded in a UTOC (User Table Of Contents) area, comprises:

information reproducing means for reproducing information recorded on said record medium and for outputting reproduction signals;

time-code reading means for reading, from the UTOC area of said record medium, a time code indicating a head of a track from which said information reproducing means is going to reproduce the information; and time-code generating means for generating a time code synchronized with reproduction signals of the track in question based on the time code indicating the head of the track, read by said time-code reading means.

Here, the record medium having a UTOC area is, for example, an MD (Mini-disc), solid-state memory card, or the like.

According to the second mode of the present invention, employing the above-described construction, time codes synchronized with the reproduction signals can be generated by reproducing information from the record medium on which signals have been recorded, for example, by the record medium device of the above-described first mode of the present invention.

DETAILED DESCRIPTION OF THE PREFERRED EMBODIMENTS

Now, the first embodiment of the present invention will be described.

Figure 1:
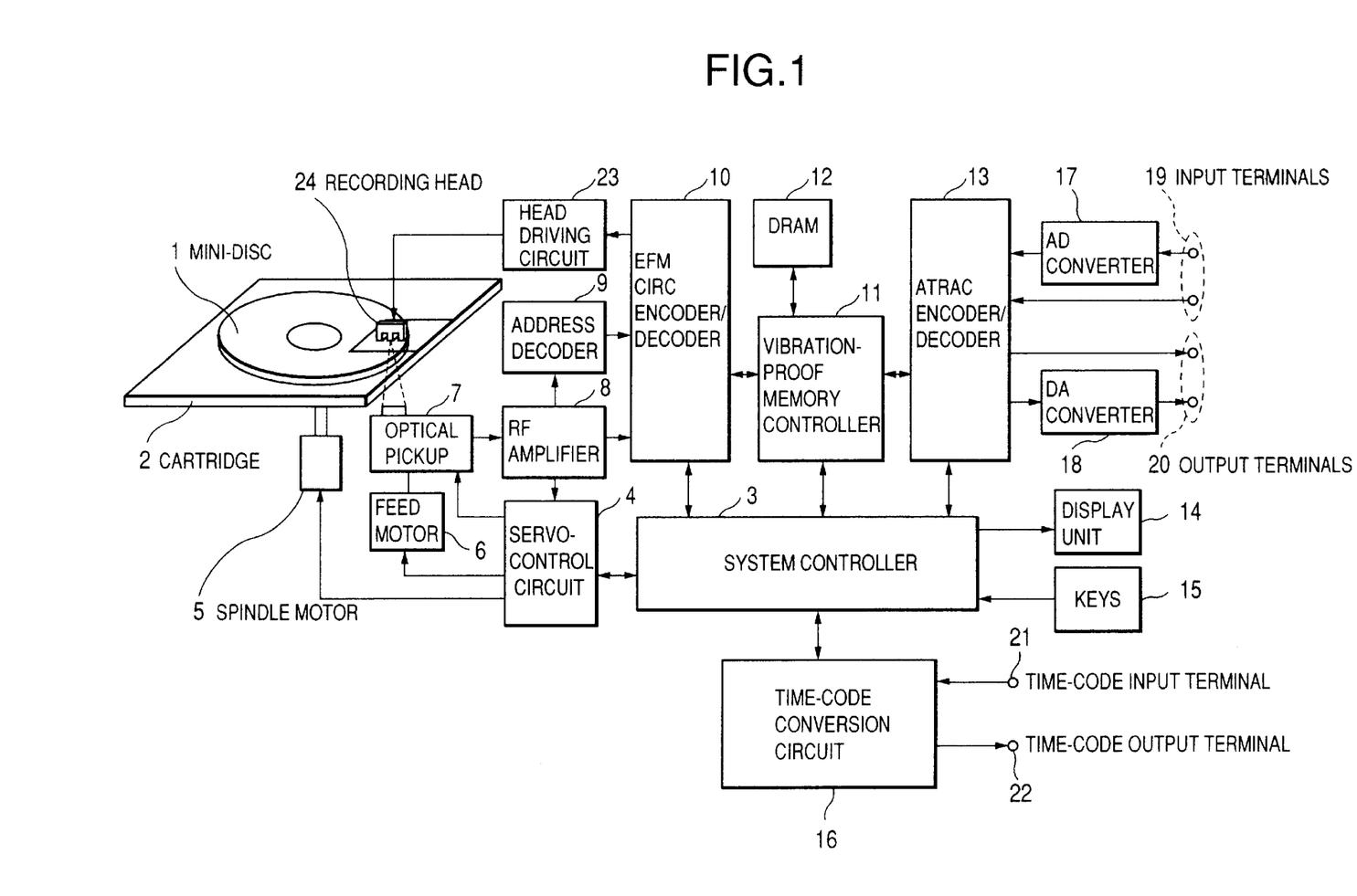
FIG. 1 is an outline block diagram showing an optical disc device as a first embodiment of the present invention.
Figure 2:
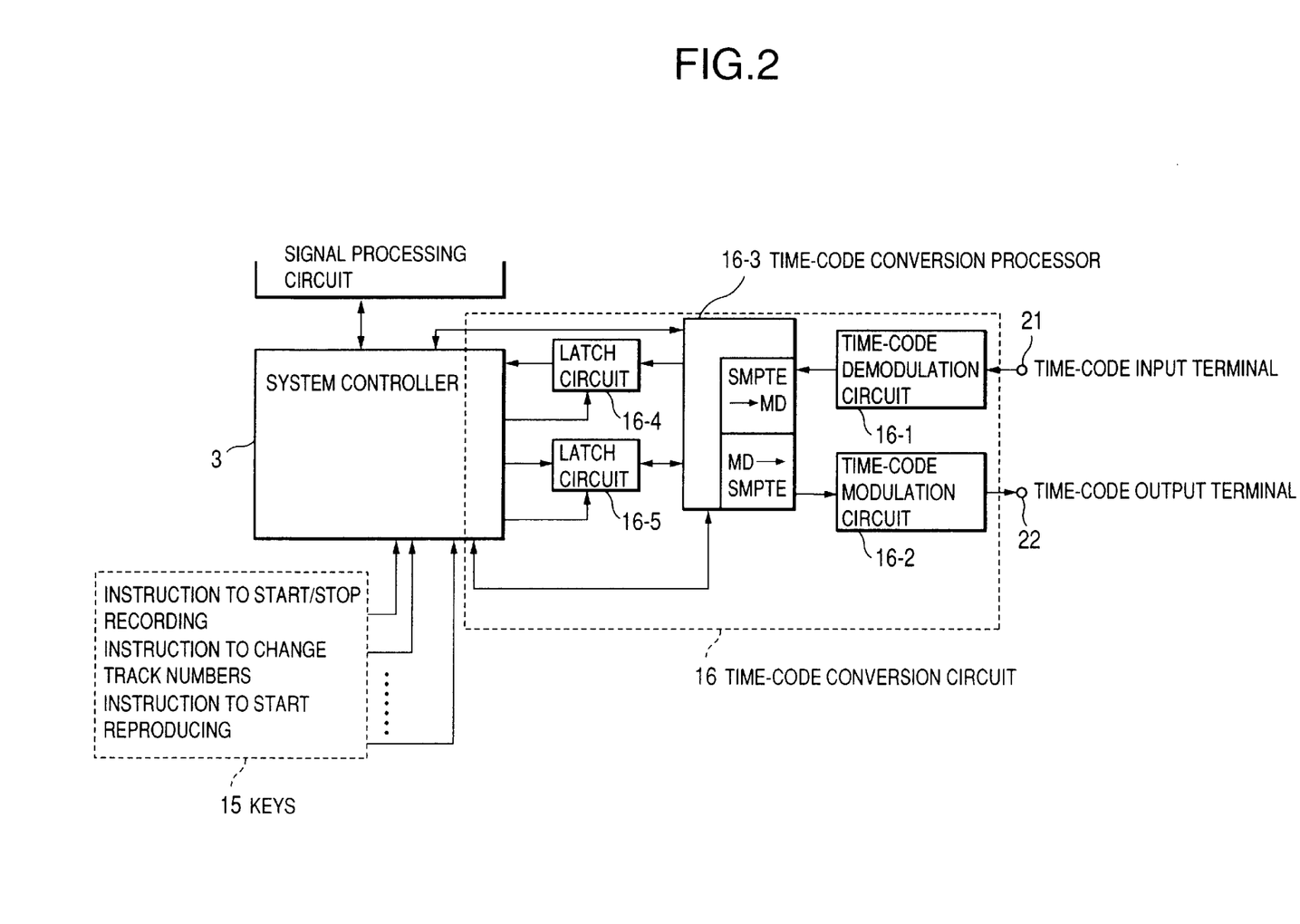
FIG. 2 is an outline block diagram showing a main part of the optical disc device of FIG. 1.

FIG. 1 is an outline block diagram showing an optical disc device as the first embodiment of the present invention, and FIG. 2 is an outline block diagram showing a main part of the optical disc device of FIG. 1.

First, referring to FIG. 1, there will be described operation of the optical disc device of the present embodiment in the case that it reproduces information recorded in an MD in the ordinary MD format.

Referring to FIG. 1, when a cartridge 2 containing an MD 1 is loaded into the optical disc device of the present embodiment, a system controller 3 drives a spindle motor 5 through servo-control circuit 4. The MD 1 is rotated by this spindle rotation.

The system controller 3 drives a feed motor 6 through the servocontrol circuit 4. As a result, an optical pickup 7 is moved radially toward the inner circumferential portion of the MD 1 to read a UTOC (User Table Of Contents). This UTOC read from the MD 1 is demodulated by an EFM (Eight to Fourteen Modulation) CIRC (Cross Interleaved Reed-Solomon Code) encoder/decoder 10 through an RF amplifier 8 and an address decoder 9, and thereafter stored in DRAM 12 through a vibration-proof memory controller 11.

Further, the system controller 3 reads the demodulated UTOC from the DRAM 12 so as to display track name information, which is information such as a table of contents of the information recorded on the MD 1, on a display unit 14.

Accordingly, an operator can carry out operational input by means of keys 15, seeing the contents shown on the display unit 14. For example, to select and reproduce the second piece of music in accordance with the contents shown on the display unit 14, it is sufficient to input "2" by using a numeric key among the keys 15. The system controller 3 then controls component parts concerned to reproduce the second piece of music recorded on the MD 1.

Namely, the system controller 3 reads the above-described demodulated UTOC from the DRAM 12, and puts it into memory within the system controller 3 beforehand, as address information of heads and ends of respective tracks (pieces of music). Then, through the servo-control circuit 4, the controller 3 controls the feed motor 6 so that the optical pickup 7 moves to the head address of the track of the second piece in the MD 1. Signals read through the optical pickup 7 are inputted to the EFM CIRC encoder/decoder 10 through the RF amplifier 8 and the address decoder 9.

The EFM CIRC encoder/decoder 10 demodulates the inputted signals, and thereafter, stores them into the DRAM 12 through the vibration-proof memory controller 11. The vibration-proof memory controller 11 reads, in time-division, the signals stored in the DRAM 12, maintaining the stored quantity of the DRAM 12 at a given level, and inputs those signals into an ATRAC (Adaptive Transform Acoustic Coding) encoder/decoder 13.

On receiving them, the ATRAC encoder/decoder 13 expands, along the time axis, the signals read from the DRAM 12 in time-division into the original continuous signals. The signals expanded along the time axis are outputted as an analogue signal from an output terminal 20 through a DA converter 18, and the digital signals are outputted from an output terminal 20 as they are.

Thus, the signals recorded in the track of the second piece of music in the MD 1 are reproduced.

Next, referring to FIG. 1, operation will be described in the case that the optical disc device of the present invention records information on an MD in the ordinary MD format.

Among signals inputted into the optical disc device of the present invention, analogue signals such as aural signals are inputted into the ATRAC encoder/decoder 13 through an input terminal 19 and an AD converter 17. On the other hand, digital signals are inputted directly into the ATRAC encoder/decoder 13 through an input terminal 19. The ATRAC encoder/decoder 13 compresses the inputted signals, and stores them temporarily in the DRAM 12 through the vibration-proof memory controller 11.

The data temporarily stored in the DRAM 12 is read through the vibration-proof memory controller 11, and modulated to signals in the MD format by the EFM CIRC encoder/decoder 10. The modulated signals are inputted into a recording head 24 through head driving circuit 23, and recorded in turn on the MD 1.

Next, referring to FIG. 2, there will be described an operation in the case that the optical disc device of the present embodiment records time codes on the MD 1.

Time code signals inputted into a time-code input terminal 21 are demodulated to time codes by time-code demodulation circuit 16-1. Here, formats of the time codes are prescribed by the IEC Publication 461. Ordinarily, they are called SMPTE/EBU (Society of Motion Picture and Television Engineers/European Broadcasting Union) time codes, including following types:

(1) 30 frame drop frame type (for color video of the NTSC system);
(2) 30 frame non-drop type TSC (for monochrome video);
(3) 25 frame non-drop type (EBU type: for video of the PAL system); and
(4) 24 frame non-drop type (for film application).

Here, it is judged whether or not drop processing is performed on time codes (i.e., the above-described type (1) applies or not), by detecting a drop frame flag ("1" or "0") in 80 bits of the prescribed time code format. If "1" is detected, it means it is a drop frame type. As a method of judging the above types (1)–(4), the number of frames per second may be measured, or frame values may be compared to measure the maximum value. For example, if a drop frame flag is "1" and maximum frame value is 30, it means the type (1), i.e., 30 frame drop frame type. To distinguish these types, an identification signal such as an identification character B, C, D, E, or the like may be added.

A time-code conversion processor 16-3 converts time codes demodulated by the time-code demodulation circuit 16-1 to time codes for an MD. The conversion is performed by making correspondence between a frame as the minimum time unit of MD and a frame for a time code. The frame for MD has a rate of 86.7 Hz. On the other hand, for example, the frame for the time code of the NTSC system (color image) has a rate of 29.97 Hz. Thus, MD has higher resolution. The phase shift of the correspondence of these two frames comes within ±11 ms at maximum. As phase shift at the time of synchronous control, this is not a problematic level. However, for strict time code synchronization, phase shift information is detected, and correction information is recorded, together with an identification character for distinguishing type of time codes, onto an MD 1. At the time of reproduction, phase correction is performed based on this correction information.

The time codes for MD generated by the time-code conversion processor 16-3 are inputted into the system controller 3. Latch circuit 16-4 latches the time code (start time code) in timing with the start of recording or change of track numbers. Further, the latch circuit 16-4 latches the time code (end time code to be stored as a track name) in timing with the end of the record or change of tracks. These latched time codes are stored, together with a character code "A" for recognizing time code, in a track name storing area of a UTOC of the MD 1.

Figure 3:
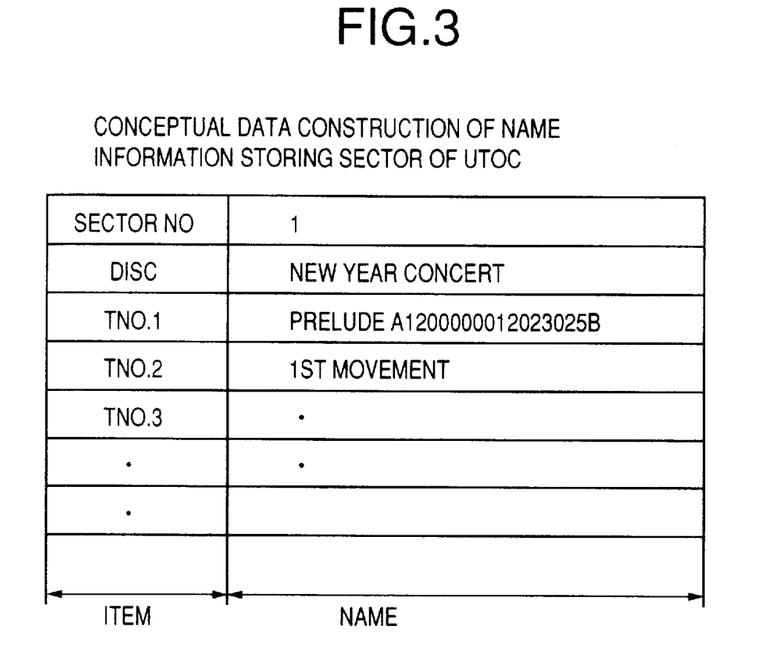
FIG. 3 is a conceptual view showing data construction of a name information storing sector of a UTOC.

FIG. 3 is a conceptual view illustrating data construction of a name information storing sector of the UTOC of the MD 1.

As shown in FIG. 3, the data construction of the name information storing sector of the UTOC includes a sector number "1" which indicates that this sector is the name information storing sector in the UTOC area, items which indicate objects assigned respective names, and names. The names are recorded in the ASCII (American Standard Code Information Interchange) code. This name information storing sector can store one disc name, and names of 255 tracks at maximum. Although each name can have 1792 characters at maximum, the UTOC has the capacity of 1792 characters as a whole. Accordingly, a number of characters may be assigned to each track in advance so that a plurality of track names are stored.

For example, in FIG. 3, a track name of the track number 1 (TNo. 1) is "Prelude", and the 16 digit number following the character code "A" for recognizing time code is taken as time code information. Out of "12000000012023025B" following "A", "12000000" is a time code showing the head of the track (in this case, 12 hours 00 minutes 00 seconds 00 frames). Further, "12023025" is a time code showing the end of the track (in this case, 12 hours 02 minutes 30 seconds 25 frames). The character "B" following these numerals indicates the type of the time code (in this case, 30 frame drop type).

To show time code information, 18 characters are needed for one track, including the character code "A" for recognizing time code. As described above, the capacity of the UTOC as a whole is restricted to 1792 characters. Thus, at maximum, 99 tracks can be assigned with time codes. By providing a monitor for the number of characters recorded as a name and a limiter for the number of characters in recording operation, this does not cause a problem in practice.

Figure 4:
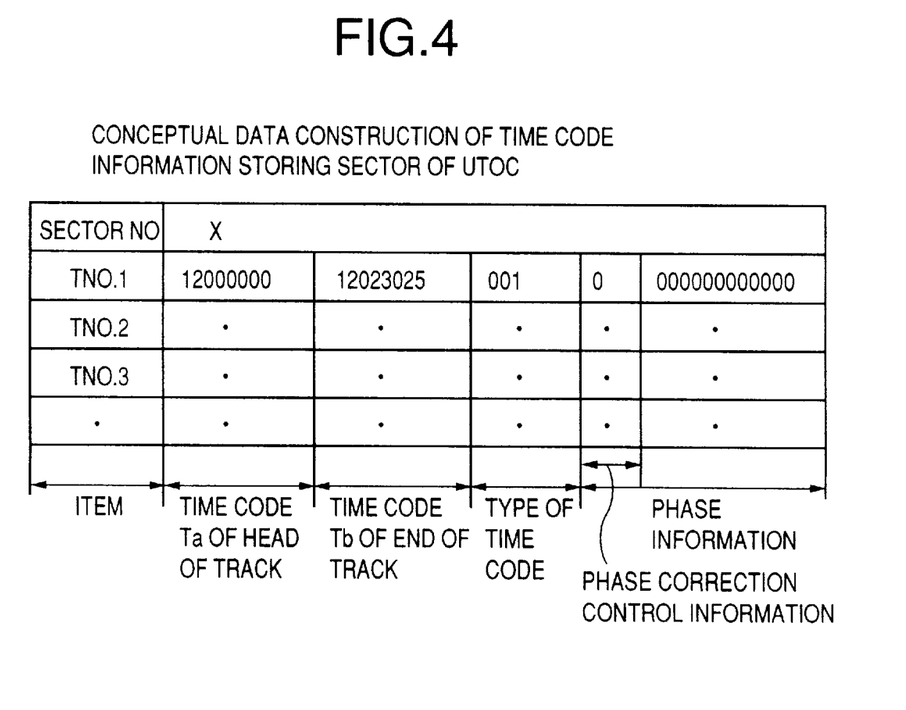
FIG. 4 is a conceptual view showing data construction of a time code information storing sector of a UTOC.

The time code information may be stored in a time code information storing sector provided dedicatedly in the UTOC area of MD 1, instead of the name information storing sector of the UTOC.

FIG. 4 is a conceptual view explaining data construction of a time code information storing sector dedicatedly provided in the UTOC area of MD 1.

As shown in FIG. 4, data recorded in the time code information storing sector of the UTOC includes a sector code "X" which indicates that this sector is the time code information storing sector in the UTOC area, track numbers (TNo. 1–TNo. 255), time codes indicating heads of respective tracks, time codes indicating ends of respective tracks, information indicating a type of time code, and phase information.

The phase information indicates time, which is expressed in the number of sampling pulses, elapsed from the start of the frame of the inputted time code until the start of minimum unit SG (Sound Group) of address of MD. The phase information has 12 bits, and is expressed in 2's complement including polarity. This phase information may not be recorded when phase shift can be ignored. It is defined that, when the phase correction control information bit is "0", phase correction is not performed.

Each one digit of the time code information is recorded with 4 bits BCD (Binary-Coded Decimal) code, amounting to 10 bytes of data for each track. In the time code information storing sector, time code information of 167 tracks at maximum can be recorded.

Now, it is assumed that the character code "A" for recognizing time code exists after a track name, for example, "Prelude" read from the MD 1, and following them, there exist a time code Ta for the head of the track and a time code Tb for the end of the track.

When T is assumed to be a real time length of the track for which the time codes Ta, Tb are recorded following the track name, the timecode conversion processor 16-3 corrects operation clock time t of the MD with the rate of time correction (Tb−Ta)/T. Thus, a time code Ta+(Tb−Ta)/T·t is calculated. The converted time code is modulated to a time code signal by a time-code modulation circuit 16-2, and thereafter outputted through a time-code output terminal 22.

Next, referring to a flowchart of FIG. 5, there will be described operation of the optical disc device of the present embodiment as a whole, in the case that information is recorded on the MD 1.

Figure 5:
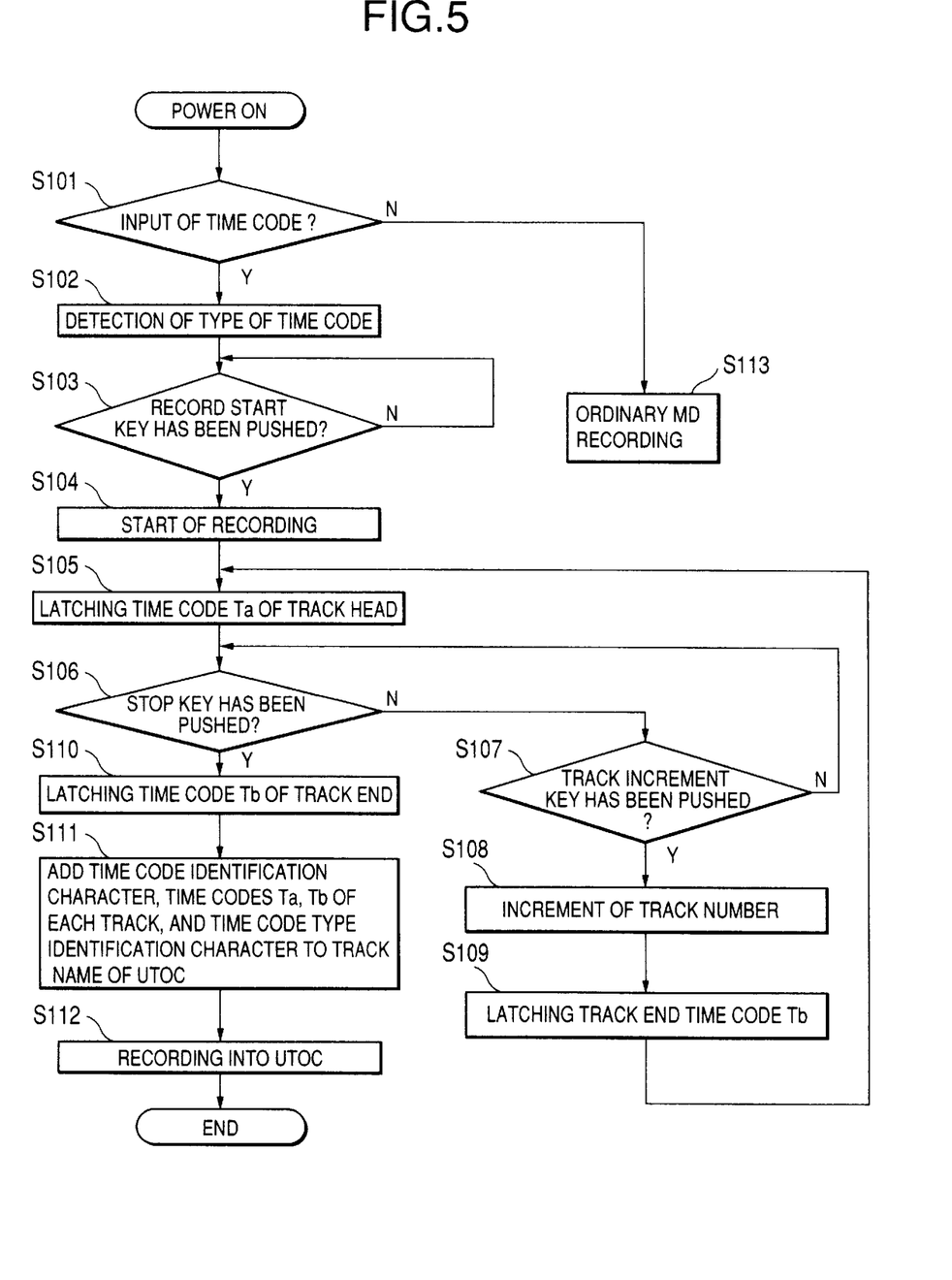
FIG. 5 is a flowchart explaining operation of recording by the optical disc device of FIG. 1.

FIG. 5 is a flowchart explaining the operation of the optical disc device of the present embodiment as a whole, in the case that information is recorded on the MD 1.

First, in Step S101, when time code signal is inputted into the time-code input terminal 21, this time code signal is demodulated by the time-code demodulation circuit 16-1. The system controller 3 judges which type of SMPTE/EBU time codes corresponds to the demodulated time code. On the other hand, when a time code signal is not inputted into the time-code input terminal 21, the above-described ordinary recording of the MD is performed (Step S113).

In Step S102, the system controller 3 detects the type of inputted time code from the frame period and the drop frame flag. Then, signals recorded in the MD recording format are reproduced to obtain time codes for tracks which have been recorded, and a record map, which shows TOC and type of the time codes, is produced and stored into the memory within the system controller 3.

In Step S103, the system controller 3 waits for input of an instruction to start recording with a key for instructing to start or stop recording, among the keys 15. Here, the time code signal inputted through the time-code input terminal 21 and input signals inputted through the input terminal 19 are inputted synchronously. When an instruction to start recording is inputted, the input signals are processed in the ATRAC encoder/decoder 13 to be subjected to data compression, and then stored into the DRAM 12 through the vibration-proof memory controller 11.

In Step S104, the system controller 3 reads the signals stored in the DRAM 12 through the vibration-proof memory controller 11. These signals are compressed along the time axis according to the record format of MD in the EFM CIRC encoder/decoder 10, and thereafter inputted into the recording head 24 through head driving circuit 23. As a result, recording onto the MD 1 is started.

In Step S105, the latch circuit 16-4 of the time-code conversion circuit 16 latches a time code inputted, in timing with start of recording onto the MD 1. This time code becomes the time code Ta indicating the head of the track.

In Step S106, the system controller 3 judges whether or not a record stop key has been pushed among the keys 15, or whether or not a stop code has been inputted through the input terminal 19.

When the record stop key has not been pushed and a stop code is not inputted, it is judged whether or not a key for increment of track number, among the keys 15, has been operated (Step S107). When it has not been operated, returning to Step S106, it is judged again whether or not the record stop key in the keys 15 has been pushed. When the key for increment has been operated, the track number is incremented (Step S108), to change recording tracks. In this case, the latch circuit 16-4 of the time-code conversion circuit 16 latches a time code inputted, in timing with change of tracks (Step S109). This time code becomes the time code Tb indicating the end of the track. The time codes indicating the head and end of the track are stored into the memory within the system controller 3, together with an identification code on the type of time codes.

Accordingly, each time a track is incremented, an identification code indicating a time code type, a time code indicating a head of a track, and a time code indicating an end of the track are stored into the memory within the system controller 3.

On the other hand, in Step S106, when the record stop key in the keys 15 is pushed, or when a stop code is inputted to the input terminal 19, the system controller 3 detects it and stops recording into the track.

In that case, the latch circuit 16-4 of the time-code conversion circuit 16 latches a time code inputted, in timing with pushing of the record stop key or input of the stop code (Step S110). This time code becomes the time code Tb indicating the end of the track. The system controller 3 stores the latched time code into the memory within the system controller 3.

Further, the system controller 3 moves the optical pickup 7 and the recording head 24 to the UTOC area of the MD 1 through the servocontrol circuit 4. Then, for each track, the character code "A" for recognizing time code, time codes Ta and Tb indicating the head and end of the track respectively, and an identification code (one of "B", "C", "D" and "E") indicating the time code type are added to the name information on the track in question, as UTOC information (Step S111), and they are stored in the UTOC area of the MD 1 (Step S112).

According to the above-described flow, the signals inputted through the input terminal 19 are compressed along the time axis, and stored into respective tracks of the MD 1. Here, recording into each track of the MD is made so that the position of the recorded signals can be detected. Accordingly, by recording the time codes of the head and end of each track into the UTOC area, the time codes of the original input signals can be reproduced, when the signals are reproduced.

Next, referring to a flowchart of FIG. 6, there will be described operation of the optical disc device of the present embodiment as a whole, in the case that information recorded on the MD 1 is reproduced by the device.

Figure 6:
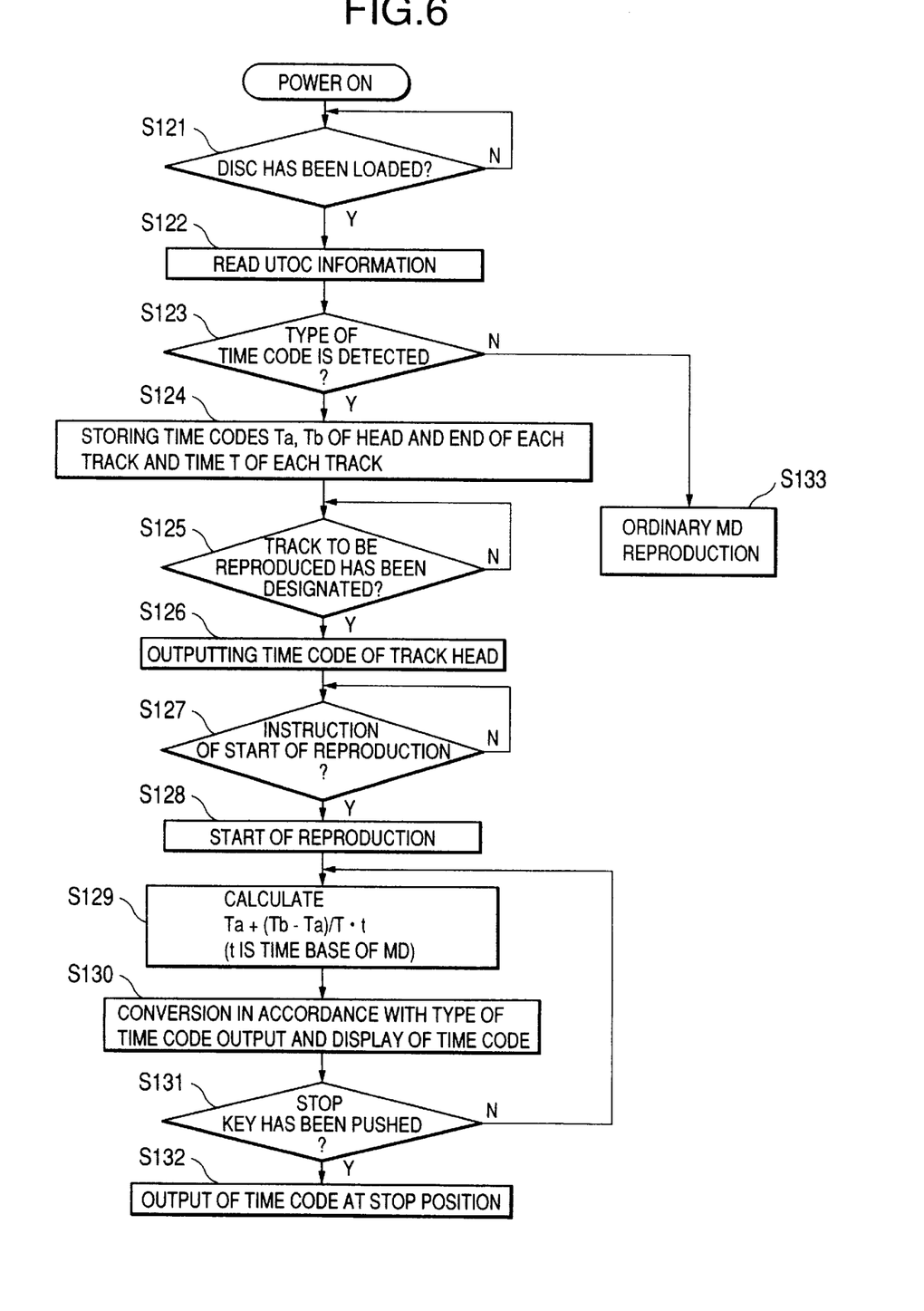
FIG. 6 is a flowchart explaining operation of reproduction by the optical disc device of FIG. 1.

FIG. 6 is a flowchart explaining the operation in the case that the device of the present embodiment reproduces information recorded on the MD 1.

First, in Step S121, the system controller 3 judges whether the MD 1 has been loaded or not. If the MD 1 has been loaded, the feed motor 6 controlled by the servo-control circuit 4 moves the optical pickup 7 to the UTOC area recorded in the inner circumferential portion of the MD 1. Further, the MD 1 is driven in a controlled manner by the spindle motor 5 at a given rotation rate.

In Step S122, the optical pick up 7 reads the UTOC information recorded on the MD 1. This information is inputted into the EFM CIRC encoder/decoder 10 through the RF amplifier 8 and the address decoder 9. The EFM CIRC encoder/decoder 10 demodulates the inputted UTOC information, and stores it temporarily into the DRAM 12 through the vibration-proof memory controller 11.

In Step S123, the system controller 3 takes name information on each track out of the UTOC information read from the MD 1, and stores it into the memory within the system controller 3. At that time, it is judged whether the character code "A" for recognizing time code is added to the name information or not. When the character code "A" is not added, moving to Step S133, the above-described ordinary MD reproduction is performed.

On the other hand, in the case where the character code for recognizing time code is added, an identification code on the time code types (one of "B", "C", "D" and "E") is detected to recognize a type of time code to be outputted.

In Step S124, for each track, the system controller 3 stores, into the memory within the system controller 3, the time codes Ta and Tb respectively indicating the head and end of the track in question, total time T of the track, and the identification code of the time code type, these being included in the name information of each track taken out from the read UTOC information. As a result, the device is put in a reproduction standby state.

At this time, the system controller 3 displays record contents such as a table of contents information, the type of time codes, and the like on the display unit 14, based on the UTOC information.

In Step S125, the system controller 3 waits for input with the keys 15, which designates a track to be reproduced. When designation of a track to be reproduced is inputted, the system controller 3 moves the optical pickup 7 to the head position of the designated track. Then, information recorded in the track in question is read and stored into the DRAM 12.

In Step S126, the time-code conversion processor 16-3 of the time-code conversion circuit 16 starts calculation of a time code to be outputted in accordance with a time code format specified by the time code type identification code, on the track designated in Step S125, stored in the memory within the system controller 3. Further, a latch circuit 16-5 of the time-code conversion circuit 16 latches the time code indicating the head of the track in question. The latched time code is modulated to a time code signal in the time-code modulation circuit 16-2, and outputted through the time-code output terminal 22.

Here, the time code signal outputted through the time-code output terminal 22 is synchronized with a reference time recorded by a VCR or the like. Further, the signals recorded in the DRAM 12 are read from the DRAM 12 so as to be reproduction signals synchronized with the time code specified by the time code signal, and outputted through the output terminal 20. The system controller 3 can synchronize the time code signal outputted through the time-code output terminal 22 with the time code signal inputted through the time-code input terminal 21. As a result, reproduction signals outputted through the output terminal 20 can be controlled synchronously.

In Step S127, the system controller 3 judges whether a reproduction start key among the keys 15 has been pushed, or whether a signal instructing reproduction has been inputted from another device through the time-code input terminal 21.

When the reproduction start key in the keys 15 has been pushed or when a signal instructing reproduction has been inputted through the time-code input terminal 21, the system controller 3 reads the first data of the track from the DRAM 12. This data is inputted into the ATRAC encoder/decoder 13 through the vibration-proof memory controller 11, and expanded there. Thereafter, the data is outputted through the output terminal 20 via the DA converter 18 (Step S128). As a result, reproduction of the information recorded on the MD 1 is started.

In Step S129, signals compressed along the time axis are read from the MD 1 by the optical pickup 7, in accordance with TOC information based on time base t of the reference clock of the MD. These signals are subjected to expansion along the time axis and data correction in the EFM CIRC encoder/decoder 10, and thereafter stored into the DRAM 12.

Further, the time-code conversion processor 16-3 of the time-code conversion circuit 16 calculates time code Ta+(Tb−Ta)/T·t every moment during the reproduction, based on the time codes Ta and Tb indicating the head and end of the track being reproduced and the total time T of the track in question, stored in the memory within the system controller 3. Here, t is a time base which becomes reference clock when the information recorded on the MD is reproduced.

In Step S130, the time-code conversion processor 16-3 outputs a time code through the time-code output terminal 22 for each frame or for each given time point, in accordance with the type of time code detected in Step S123. Here, display unit 14 displays which position in the track is being reproduced using a bar graph or the like, based on the time codes outputted through the time-code output terminal 22.

In Step S131, the system controller 3 judges whether or not a stop key in the keys 15 has been pushed. If the stop key has not been pushed, returning to Step S129, the processing is continued. In this case, when reproduction of the designated track is finished, the device enters the standby state, and waits for designation of a track to be reproduced.

On the other hand, when the stop key has been pushed, the time-code conversion processor 16-3 calculates the time code of the stop position, modulates this time code to a time code signal, and outputs it through the time-code output terminal 22 (S132).

Thus, according to the above-described present embodiment, employing the above-described construction, operation of recording and reproducing data signals having time codes, generated by another device, can be performed in accordance with the original time codes generated by the device in question. Accordingly, data arrangement, such as editing, can be performed efficiently.

Further, in editing, when data is cut in the middle of a track, by storing TOC information of the cut parts into the UTOC area, it is possible to calculate a time code by subtracting the cut time from the total time T of the track.

In the above-described first embodiment of the present invention, there is explained the case where an MD is used as a record medium having a UTOC area. The present invention is not limited to that case, however. Any record medium may be used if it records signals in a format without a time code and has a UTOC area.

In the following, there will be described an example in which a solid-state memory card is used as a record medium, as a second embodiment of the present invention.

Figure 7:
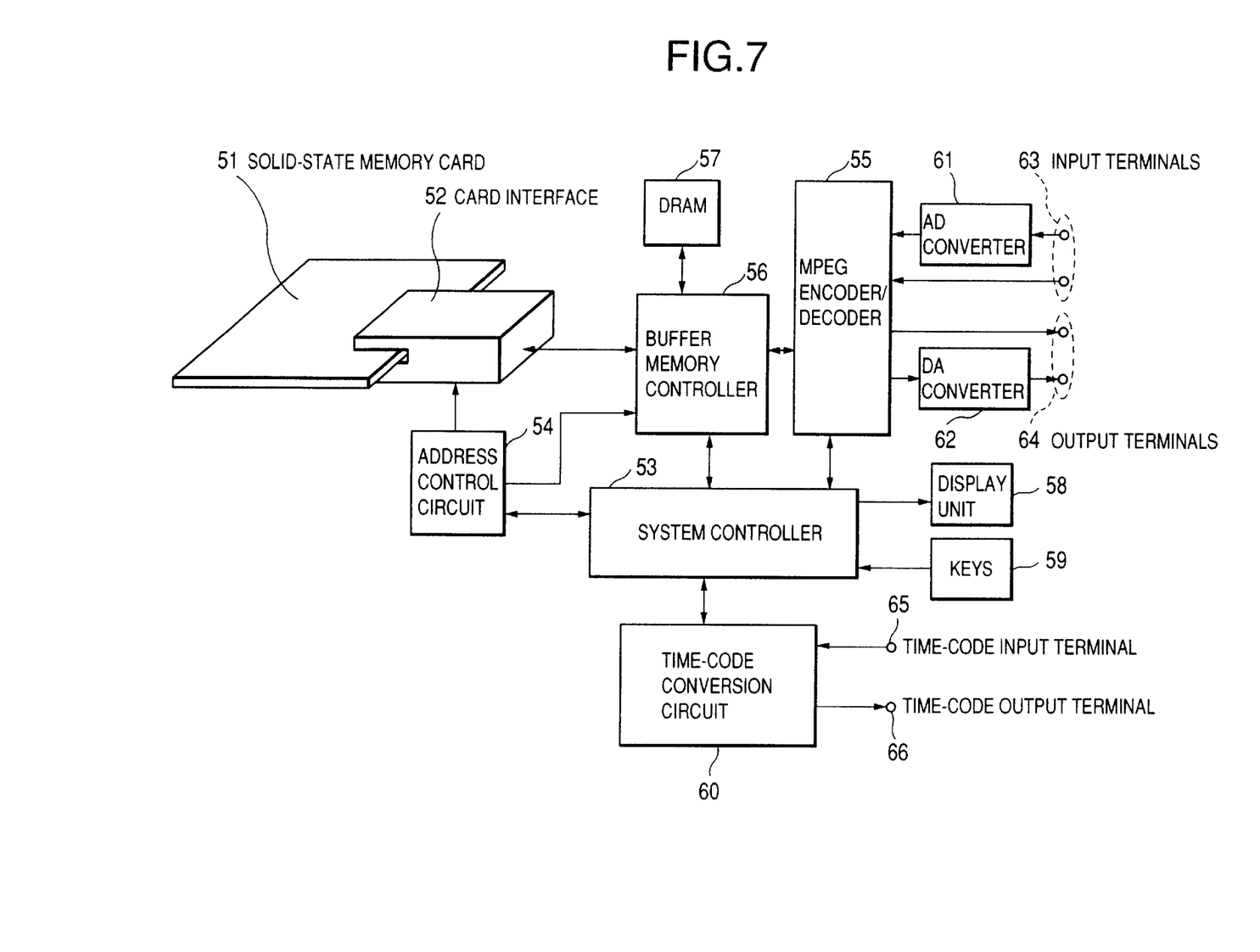
FIG. 7 is an outline block diagram showing a solid-state memory card device as a second embodiment of the present invention.
Figure 8:
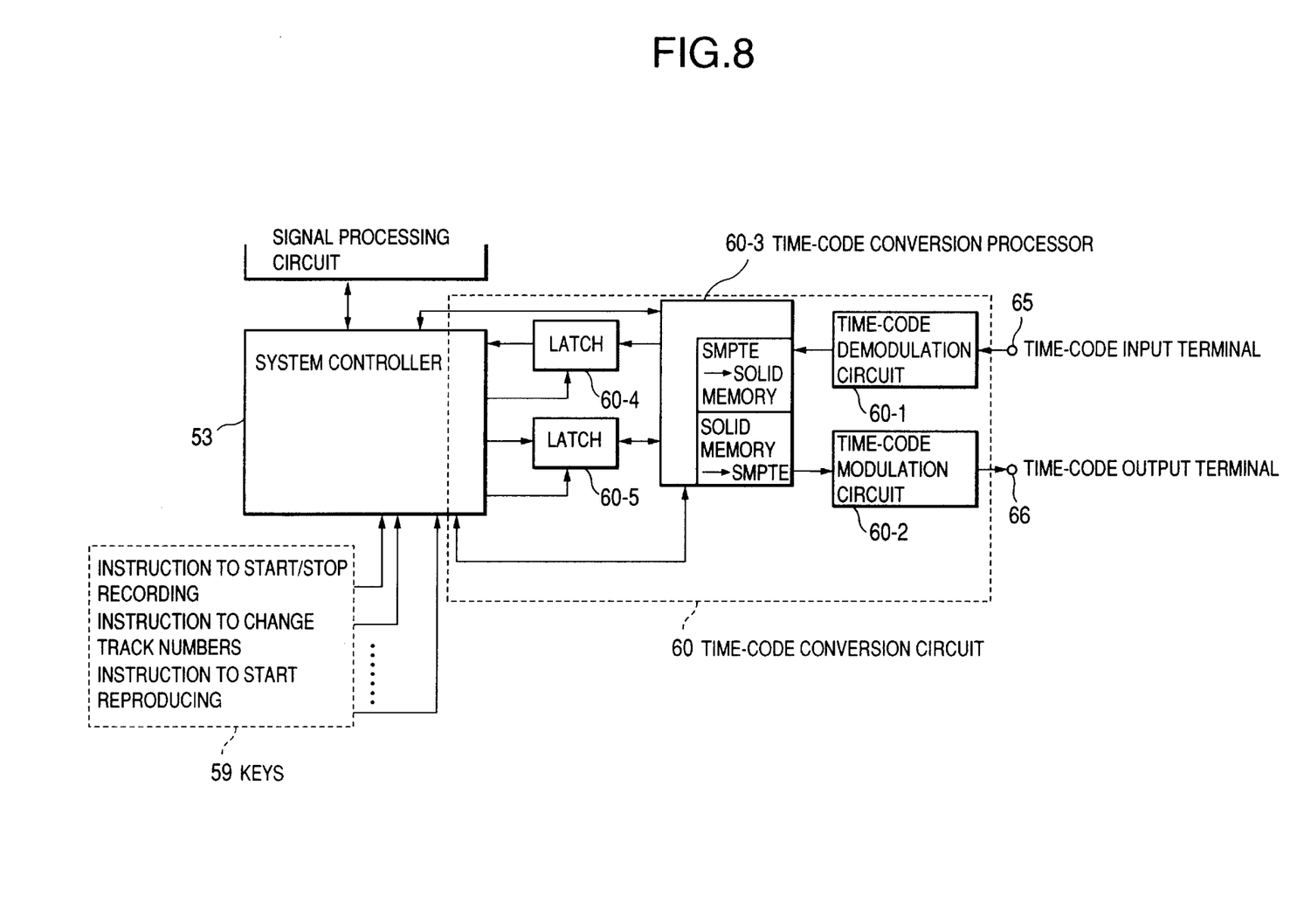
FIG. 8 is an outline block diagram showing a main part of the solid-state memory card device of FIG. 7.

FIG. 7 is an outline block diagram showing a solid-state memory card device as the second embodiment of the present invention, and FIG. 8 is an outline block diagram showing a main part of the solid-state memory card device of FIG. 7.

First, referring to FIG. 7, there will be described operation of the solid-state memory card device of the present embodiment in the case that the device reproduces information recorded in a solid-state memory card in the ordinary format.

In FIG. 7, when a solid-state memory card 51 is mounted into a card interface 52 in the solid-state memory card device of the present embodiment, a system controller 53 performs its loading, reads a UTOC stored in the solid-state memory card 51, and stores it into DRAM 57 through a buffer memory controller 56.

Further, the system controller 53 displays track name information on a display unit 58, by reading the UTOC, which has been read from the solid-state memory card above, from the DRAM 57. The track name information is information such as a table of contents of the information recorded in the solid-state memory card 51.

Accordingly, an operator can perform operational input using keys 59, seeing the contents shown on the display unit 58. For example, to select and reproduce the second piece of music in accordance with the contents shown on the display unit 58, it is sufficient to input "2" by using a numeric key among the keys 59. Then, the system controller 53 controls component parts concerned to reproduce the second piece of music recorded on the solid-state memory card 51.

Namely, the system controller 53 reads the UTOC from the DRAM 57, and puts it into memory within the system controller 53 beforehand, as address information of heads and ends of respective tracks (pieces of music). Then, through address control circuit 54, the controller 53 controls the card interface 52 to access the head address of the track of the second piece in the solid-state memory card 51. Signals read through the card interface 52 are stored into the DRAM 57 through the buffer memory controller 56.

The buffer memory controller 56 reads, in time-division, the signals stored in the DRAM 57, keeping the stored quantity of the DRAM 57 at a given level, and inputs those signals into an MPEG (Moving Picture Experts Group) encoder/decoder 55.

On receiving them, the MPEG encoder/decoder 55 expands, along the time axis, the signals read from the DRAM 57 in time-division into the original continuous signals. The signals expanded along the time axis are outputted as an analogue signal from an output terminal 64 through a DA converter 62, and the digital signals are outputted from an output terminal 64 as they are.

Thus, the signals recorded in the track of the second piece of music in the solid-state memory card 51 are reproduced.

Next, referring to FIG. 7, there will be described operation of the solid-state memory card device of the present embodiment in the case that information is recorded into the solid-state memory card in the ordinary format.

Among signals inputted into the solid-state memory card device of the present invention, analogue signals such as aural signals are inputted into the MPEG encoder/decoder 55 through an input terminal 63 and an AD converter 61. On the other hand, digital signals are inputted directly into the MPEG encoder/decoder 55 through an input terminal 63. The MPEG encoder/decoder 55 compresses the inputted signals, and stores them temporarily in the DRAM 57 through the buffer memory controller 56.

The data temporarily stored in the DRAM 57 is read through the buffer memory controller 56, and compressed along the time axis in turn and stored in a given address of the solid-state memory card 51.

Next, referring to FIG. 8, there will be described the operation in the case that the solid-state memory card device of the present embodiment records time codes on a solid-state memory card 51.

Time code signals inputted into a time-code input terminal 65 are demodulated to time codes by time-code demodulation circuit 60-1. Here, formats of the time codes are prescribed by the IEC Publication 461, as in the above-described first embodiment of the present invention.

A time-code conversion processor 60-3 converts time codes demodulated by the time-code demodulation circuit 60-1 to time codes for a solid-state memory. The conversion is performed by making correspondence between a frame as the minimum time unit of a solidstate memory card and a frame for a time code. The frame for a solidstate memory card is assumed to have a rate of 86.7 Hz. On the other hand, for example, the frame for the time code of the NTSC system (color image) has a rate of 29.97 Hz. Thus, a solid-state memory card has higher resolution. The phase shift of the correspondence of these two frames comes within approximately ±11 ms at maximum. As phase shift at the time of synchronous control, it is as allowable as lip-sync. However, for strict time code synchronization, phase shift information is detected, and correction information is recorded, together with an identification character for distinguishing types of time codes, into a solid-state memory card 51. At the time of reproduction, phase correction is performed based on this correction information.

The time codes for a solid-state memory card generated by the time-code conversion processor 60-3 are inputted into the system controller 53. Latch circuit 60-4 latches the time code (start time code to be stored as a track name) in timing with start of recording or change of track numbers. Further, the latch circuit 60-4 latches the time code (end time code to be stored as a track name) in timing with the end of the record or change of tracks. These latched time codes are stored, together with the character code "A" for recognizing time code, in a track name storing area of a UTOC area of the solid-state memory card 51.

Data construction of a name information storing sector of the UTOC of the solid-state memory card 51 is similar to the data construction of the name information storing sector of the UTOC of the MD 1 used in the first embodiment described referring to FIG. 3.

Also in the present embodiment, similarly to the first embodiment shown in FIG. 4, the time code information may be stored in a time code information storing sector provided dedicatedly in the UTOC area of the solid-state memory card, instead of the name information storing sector of the UTOC.

Next, referring to a flowchart of FIG. 9, there will be described operation of the solid-state memory card device of the present embodiment as a whole, in the case that information is recorded into the solid-state memory card 51.

Figure 9:
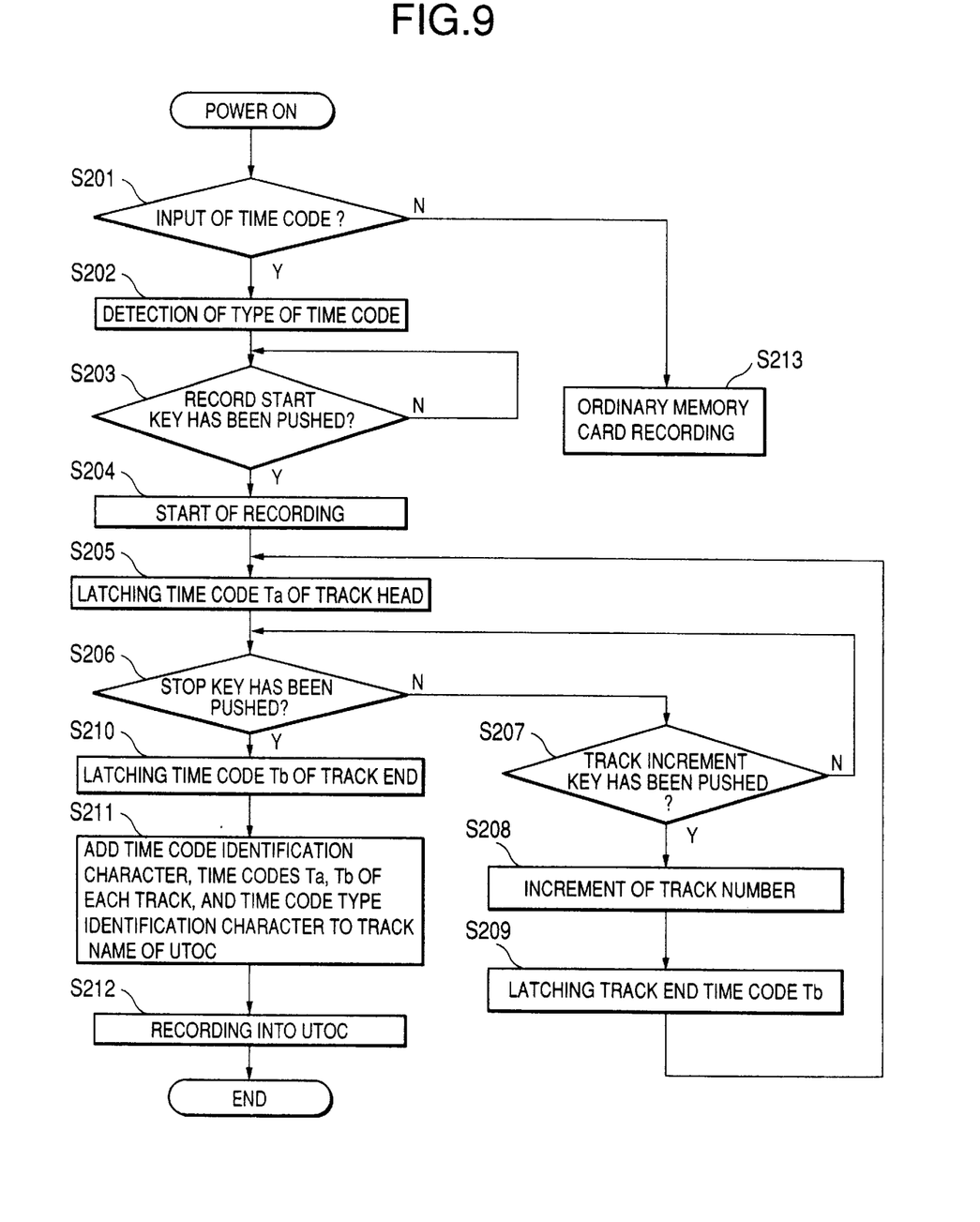
FIG. 9 is a flowchart explaining operation of recording by the solid-state memory card device of FIG. 7.

FIG. 9 is a flowchart explaining the operation of the device of the present embodiment as a whole, in the case that the device records information into the solid-state memory card 51.

First, in Step S201, when time code signal is inputted into the time-code input terminal 65, this time code signal is demodulated to a time code by the time-code demodulation circuit 60-1. The system controller 53 judges which type of SMPTE/EBU time codes corresponds to the demodulated time code. On the other hand, when time code signal is not inputted into the time-code input terminal 65, the above-described ordinary recording of a solid-state memory card is performed (Step S213).

In Step S202, the system controller 53 detects the type of the inputted time code from the frame period and the drop frame flag. Then, signals recorded in the recording format of the solid-state memory card are reproduced to obtain time codes for tracks which have been recorded, and a record map, which shows a TOC and a type of the time codes, is produced and stored into the memory within the system controller 53.

In Step S203, the system controller 53 waits for input of an instruction to start recording with a key for instructing to start or stop recording, among the keys 59. Here, the time code signal inputted through the time-code input terminal 65 and input signals inputted through the input terminal 63 are inputted synchronously. When an instruction to start recording is inputted, the input signals are processed in the MPEG encoder/decoder 55 to be subjected to data compression, and then stored into the DRAM 57 through the buffer memory controller 56.

In Step S204, the system controller 53 reads the signals stored in the DRAM 57 through the buffer memory controller 56. These signals are inputted into the card interface 52. As a result, recording into the solid-state memory card 51 is started.

In Step S205, the latch circuit 60-4 of the time-code conversion circuit 60 latches a time code inputted, in timing with start of recording into the solid-state memory card 51. This time code becomes the time code Ta indicating the head of the track.

In Step S206, the system controller 53 judges whether or not a record stop key in the keys 59 has been pushed, or whether or not a stop code has been inputted through the input terminal 63.

When the record stop key has not been pushed and a stop code is not inputted, it is judged whether or not a key for increment of track number, among the keys 59, has been operated (Step S207). When it has not been operated, returning to Step S206, it is judged again whether the record stop key in the keys 59 has been pushed or not. When the key for increment has been operated, the track number is incremented (Step S208), to change recording tracks. In this case, the latch circuit 60-4 of the time-code conversion circuit 60 latches a time code inputted, in timing with change of tracks (Step S209). This time code becomes the time code Tb indicating the end of the track. The time codes indicating the head and end of the track are stored into the memory within the system controller 53, together with an identification code on the type of the time codes.

Accordingly, each time a track is incremented, an identification code indicating a time code type, a time code indicating a head of a track, and a time code indicating an end of the track are stored into the memory within the system controller 53.

On the other hand, in Step S206, when the record stop key in the keys 59 is pushed, or when a stop code is inputted through the input terminal 63, the system controller 53 detects it and stops recording to the track.

In that case, the latch circuit 60-4 of the time-code conversion circuit 60 latches a time code inputted, in timing with pushing of the record stop key or input of the stop code (Step S210). This time code becomes the time code Tb indicating the end of the track. The system controller 53 stores the latched time code into the memory within the system controller 53.

Further, the system controller 53 accesses the UTOC area of the solid-state memory card 51 through the card interface 52. Then, for each track, the character code "A" for recognizing time code, time codes Ta and Tb indicating the head and end of the track respectively, and an identification code (one of "B", "C", "D" and "E") indicating the time code type are added to the name information on the track in question, as UTOC information (Step S211), and they are stored in the UTOC area of the solid-state memory card (Step S212).

According to the above-described flow, the signals inputted through the input terminal 63 are compressed along the time axis, and stored into respective tracks of the solid-state memory card 51. Here, recording into each track of the solid-state memory card is made so that position of the signals recorded as TOC information can be detected. Accordingly, by recording the time codes of the head and end of each track into the UTOC area, the time codes of the original input signals can be reproduced, when the signals are reproduced.

Next, referring to a flowchart of FIG. 10, there will be described operation of the solid-state memory card device of the present embodiment as a whole, in the case that information recorded on the solid-state memory card 51 is reproduced by the device.

Figure 10:
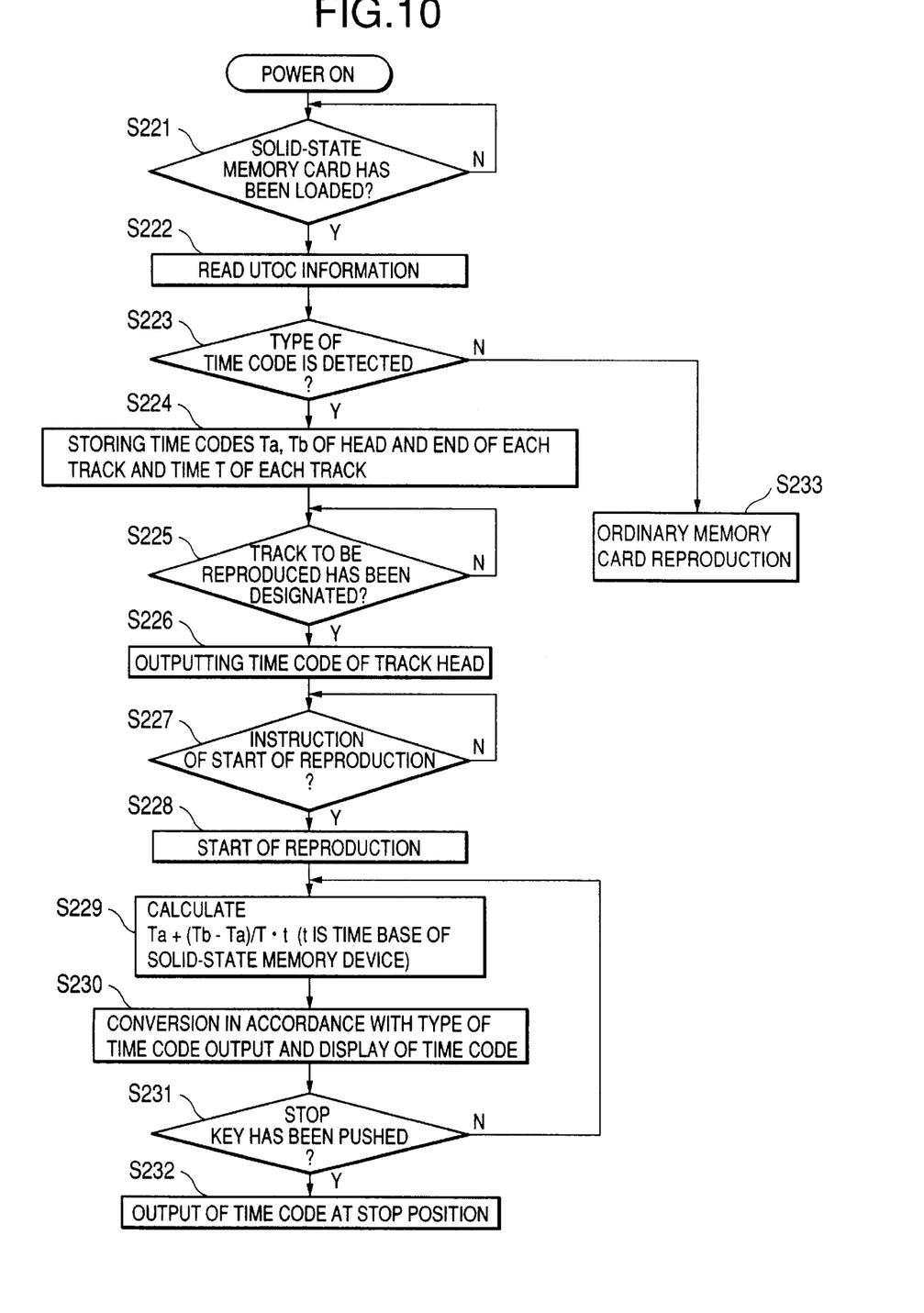
FIG. 10 is a flowchart explaining operation of reproduction by the solid-state memory card device of FIG. 7.

FIG. 10 is a flowchart explaining the operation in the case that the solid-state memory card device of the present embodiment reproduces information recorded in the solid-state memory card 51.

First, in Step S221, the system controller 53 judges whether or not the solid-state memory card 51 has been loaded. If the solid-state memory card 51 has been loaded, the system controller 53 reads, through the card interface 52, the UTOC information recorded in the solid-state memory card 51. This information is stored into the DRAM 57 temporarily through the buffer memory controller 56.

In Step S223, the system controller 53 takes name information on each track out of the UTOC information read from the solid-state memory card 51, and stores it into the memory within the system controller 53. At that time, it is judged whether or not the character code "A" for recognizing time code is added to the name information. When the character code "A" for recognizing time code is not added, moving to Step S233, the above-described ordinary solid-state memory card reproduction is performed.

On the other hand, in the case that the character code for recognizing time code is added, an identification code of the time code types (one of "B", "C", "D" and "E") is detected to recognize a type of time code to be outputted.

In Step S224, for each track, the system controller 53 stores, into the memory within the system controller 53, the time codes Ta and Tb respectively indicating the head and end of the track in question, total time T of the track, and the identification code of the time code type, these being included in the name information of each track taken out from the read UTOC information. As a result, the device becomes in a reproduction standby state.

At this time, the system controller 53 displays record contents such as a table of contents information, the type of time codes, and the like on the display unit 58, based on the UTOC information.

In Step S225, the system controller 53 waits for input with the keys 59, which designates a track to be reproduced. When designation of a track to be reproduced is inputted, the system controller 53 accesses the designated track through the card interface. Then, information recorded in the track in question is read and stored into the DRAM 57.

In Step S226, the time-code conversion processor 60-3 of the time-code conversion circuit 60 starts calculation of a time code to be outputted in accordance with a time code format specified by the time code type identification code, for the track designated in Step S225, stored in the memory within the system controller 53. Further, a latch circuit 60-5 of the time-code conversion circuit 60 latches the time code indicating the head of the track in question. The latched time code is modulated to a time code signal in the time-code modulation circuit 60-2, and outputted through the time-code output terminal 66.

Here, the time code signal outputted through the time-code output terminal 66 is synchronized with a reference time recorded by a VCR or the like. Further, the signals recorded in the DRAM 57 are read from the DRAM 57 so as to be reproduction signals synchronized with the time code specified by the time code signal, and outputted through the output terminal 64. The system controller 53 can synchronize the time code signal outputted through the time-code output terminal 66 with the time code signal inputted through the time-code input terminal 65. As a result, reproduction signals outputted through the output terminal 64 can be controlled synchronously.

In Step S227, the system controller 53 judges whether a reproduction start key in the keys 59 has been pushed, or whether a signal instructing reproduction has been inputted from another device through the time-code input terminal 65.

When the reproduction start key in the keys 59 has been pushed or when a signal instructing reproduction has been inputted through the time-code input terminal 65, the system controller 53 reads the first data of the track from the DRAM 57. This data is inputted into the MPEG encoder/decoder 55 through the buffer memory controller 56, and expanded there. Thereafter, the data is outputted through the output terminal 64 via the DA converter 62 (Step S228). As a result, reproduction of the information recorded in the solid-state memory card 51 is started.

In Step S229, the system controller 53 reads signals compressed along the time axis from the solid-state memory card 51 through the card interface 52, based on time base t of the reference clock of the solid-state memory card 51. These signals are subjected to expansion along the time axis and data correction in the MPEG encoder/decoder 55, and thereafter stored into the DRAM 57.

Further, the time-code conversion processor 60-3 of the time-code conversion circuit 60 calculates time code Ta+(Tb−Ta)/T·t every moment during the course of reproduction, based on the time codes Ta and Tb respectively indicating the head and end of the track being reproduced and the total time T of the track in question, stored in the memory within the system controller 53. Here, t is a time base which becomes a reference clock when the information recorded on the solid-state memory card 51 is reproduced.

In Step S230, the time-code conversion processor 60-3 outputs a time code through the time-code output terminal 66 for each frame or for each given time point, in accordance with the type of the time code detected in Step S223. Here, display unit 58 displays which position in the track is being reproduced using a bar graph or the like, based on the time codes outputted through the time-code output terminal 66.

In Step S231, the system controller 53 judges whether or not a stop key in the keys 59 has been pushed. If the stop key has not been pushed, returning to Step S229, the processing is continued. In this case, when reproduction of the designated track is finished, the device enters the standby state, and waits for designation of a track to be reproduced.

On the other hand, when the stop key has been pushed, the time-code conversion processor 60-3 calculates the time code of the stop position, modulates this time code to a time code signal, and outputs it through the time-code output terminal 66 (S232).

Thus, according to the above-described present embodiment, employing the above-described construction, operation of recording and reproducing data signals having time codes, generated by another device, can be performed in accordance with the original time codes generated by the device in question, similarly to the first embodiment of the present invention. Accordingly, data arrangement, such as editing, can be performed efficiently.

Further, in editing, when data is cut in the middle of a track, by storing information of the cut time into the UTOC area, it is possible to calculate a time code by subtracting the cut time from the total time T of the track.

Thus, as described above, according to the present invention, a time code indicating a head of a track, which is necessary for calculating time codes, is stored in a UTOC area. Accordingly, at the time of reproduction, time codes in the middle of the reproduction can be calculated based on the stored time code, and can be outputted.

What is claimed is:

1. A record medium device which records time codes synchronized with input signals into a record medium having a UTOC (User Table Of Contents) area, comprising:

input signal recording means for recording input signals into said record medium;

time-code obtaining means for obtaining a time code indicating a head of a track of said input signals from the time codes synchronized with said input signals; and time-code recording means for recording the time code, which indicates the head of the track and is obtained by said time-code obtaining means, into the UTOC area of said record medium, relating said time code to the track.

2. The record medium device according to claim 1, wherein:

said time-code obtaining means obtains the time code indicating the head of the track of the input signals by latching a time code synchronized with the input signals in timing with start of recording the input signals into said record medium and/or change of tracks of the input signals.

3. The record medium device according to claim 1, wherein:

said time-code obtaining means further obtains a time code indicating an end of the track of the input signals from the time codes synchronized with the input signals, and said time-code recording means records the time codes indicating the head and end of the track, obtained by said time-code obtaining means, into the UTOC area of said record medium, relating said time codes to the track.

4. The record medium device according to claim 3, wherein:

said time-code obtaining means obtains the time code indicating the end of the track of the input signals by latching a time code synchronized with the input signals in timing with end of recording the input signals into said record medium and/or change of tracks of the input signals.

5. The record medium device according to claim 1, wherein: said record medium device further comprises:

time-code signal input means for inputting a time code signal; and time-code demodulation means for demodulating the time code signal inputted through said time-code signal input means to time codes synchronized with the input signals, and said time-code obtaining means obtains the time code indicating the head of the track of the input signals from time codes demodulated by said time-code demodulation means.

6. The record medium device according to claim 1, wherein:

said record medium device further comprises a time-code type distinguishing means for distinguishing types of time codes synchronized with the input signals, based on said time codes; and said time-code recording means records the time code indicating the head of the track, obtained by the said time-code obtaining means, and information indicating a type of said time code distinguished by said time-code type distinguishing means, into the UTOC area of said record medium, relating said time code and said information to said track.

7. The record medium device according to claim 1, wherein:

said time-code recording means records the time code indicating the head of the track, obtained by said time-code obtaining means, into a name information storing sector of the UTOC area of said record medium, said name information storing sector corresponding to said track.

8. The record medium device according to claim 7, wherein:

said time-code recording means records said time code, which indicates the head of the track and is obtained by said time-code obtaining means, together with information added to said time code to identify said time code, into the name information storing sector of the UTOC area of said record medium, said name information storing sector corresponding to said track.

9. The record medium device according to claim 1, wherein:

said record medium is an MD (Mini-disc).

10. The record medium device according to claim 1, wherein:

said record medium is a solid-state memory card.

11. A record medium device which generates time codes synchronized with reproduction signals, from a record medium on which a time code indicating a head of a track is recorded in a UTOC (User Table Of Contents) area, comprising:

information reproducing means for reproducing information recorded on said record medium and for outputting reproduction signals;

time-code reading means for reading, from the UTOC area of said record medium, a time code indicating a head of a track which said information reproducing means is going to reproduce; and time-code generating means for generating a time code synchronized with reproduction signals of a track based on a time code indicating a head of said track, read by said time-code reading means.

12. The record medium device according to claim 11, wherein:

said record medium is one in which time codes indicating a head and an end of a track are recorded in the UTOC area;

said time-code reading means reads, from the UTOC area of said record medium, time codes indicating a head and an end of a track which said information reproducing means is going to reproduce; and said time-code generating means generates a time code synchronized with reproduction signals of a track based on time codes indicating a head and an end of said track, read by said time-code reading means.

13. The record medium device according to claim 12, wherein:

said time-code generating means generates a time code having a value calculated by a following equation:

$$Ta+(Tb-Ta)/T \cdot t$$

where Ta is a time code indicating a head of a track, Tb is a time code indicating an end of said track, and t is a time base which becomes reference clock when reproducing the information recorded in said record medium.

14. The record medium device according to claim 11, wherein:

said record medium is one in which a time code indicating a head of a track and information indicating a type of said time code are recorded in the UTOC area;

said time-code reading means reads, from the UTOC area of said record medium, a time code indicating a head of a track which said information reproducing means is going to reproduce, and information indicating a type of said time code; and said time-code generating means comprises:

time-code modulation means for modulating a generated time code to a time code signal in accordance with a type of the time code specified by the information read by said time-code reading means, and time-code output means for outputting the time code signal modulated by the time-code modulation means.

15. The record medium device according to claim 11, wherein:

said record medium is an MD (Mini-disc).

16. The record medium device according to claim 11, wherein:

said record medium is a solid-state memory card.

17. A record medium device which records/reproduces time codes synchronized with input/reproduction signals into/from a record medium having a UTOC (User Table Of Contents) area, comprising:

input signal recording means for recording input signals into said record medium;

time-code obtaining means for obtaining a time code indicating a head of a track of said input signals from time codes synchronized with said input signals;

time-code recording means for recording a time code which indicates a head of a track and is obtained by said time-code obtaining means, into the UTOC area of said record medium, relating said time code indicating the head of the track to said track;

information reproducing means for reproducing information recorded in said record medium and for outputting reproduction signals;

time-code reading means for reading, from the UTOC area of said record medium, a time code indicating a head of a track which said information reproducing means is going to reproduce; and time-code generating means for generating a time code synchronized with reproduction signals of a track, based on a time code indicating a head of said track, read by said time-code reading means.

18. The record medium device according to claim 17, wherein:

said time-code obtaining means further obtains a time code indicating an end of a track from time codes synchronized with input signals;

said time-code recording means records time codes which indicate a head and an end of a track and are obtained by said time-code obtaining means into the UTOC area of said record medium, relating said time codes to said track;

said time-code reading means reads, from the UTOC area of said record medium, time codes indicating a head and an end of a track which said information reproducing means is going to reproduce; and said time-code generating means generates a time code synchronized with reproduction signals of a track, based on time codes indicating a head and an end of said track, read by said time-code reading means.

19. The record medium device according to claim 17, wherein:

said time-code generating means generates a time code having a value calculated by the following equation:

$$Ta+(Tb-Ta)/T \cdot t$$

where Ta is a time code indicating a head of a track, Tb is a time code indicating an end of said track, and t is a time base which becomes reference clock when reproducing the information recorded in said record medium.

20. The record medium device according to claim 17, wherein:

said record medium is an MD (Mini-disc).

21. The record medium device according to claim 17, wherein:

said record medium is a solid-state memory card.

22. A record medium having a UTOC (User Table Of Contents) area, wherein time codes indicating a head and an end of a track are recorded in said UTOC area.

23. The record medium according to claim 22, wherein: said record medium is an MD (Mini-disc).

24. The record medium according to claim 22, wherein: said record medium is a solid-state memory card.

* * * * *